(12) United States Patent
Condemi et al.

(10) Patent No.: US 6,324,098 B1
(45) Date of Patent: Nov. 27, 2001

(54) READING CIRCUIT FOR NONVOLATILE MEMORY CELLS WITHOUT LIMITATION OF THE SUPPLY VOLTAGE

(75) Inventors: Carmelo Condemi; Michele La Placa, both of Gravina di Catania; Ignazio Martines, Catania, all of (IT)

(73) Assignee: STMicroelectronics S.R.L. (IT)

( * ) Notice: Subject to any disclaimer, the term of this patent is extended or adjusted under 35 U.S.C. 154(b) by 0 days.

(21) Appl. No.: 09/546,957

(22) Filed: Apr. 11, 2000

(30) Foreign Application Priority Data

Apr. 13, 1999 (IT) .............................. TO99A0290

(51) Int. Cl.[7] .................................................. G11C 16/00
(52) U.S. Cl. .................................... 365/185.21; 365/185.2
(58) Field of Search .............................. 365/185.21, 210, 365/185.2, 189.01, 189.09

(56) References Cited

U.S. PATENT DOCUMENTS

| | | | |
|---|---|---|---|
| 5,544,114 | * 8/1996 | Gaultier et al. | 365/185.21 |
| 5,801,988 | * 9/1998 | Pascucci | 365/185.21 |
| 5,805,500 | * 9/1998 | Campardo et al. | 365/185.21 |
| 5,886,925 | * 3/1999 | Campardo et al. | 365/185.21 |

* cited by examiner

Primary Examiner—Tan T. Nguyen

(57) ABSTRACT

A reading circuit for nonvolatile memory cells, including a current-to-voltage converter, having an array load, connected to a memory cell, and a reference load connected to a reference generator. The array load and the reference load include PMOS transistors presenting an array shape factor $(W/L)_F$ and, respectively, a reference shape factor $(W/L)_R$. The reading circuit further includes a charge pump that supplies a biasing voltage to a gate terminal of the memory cell. The biasing voltage is proportional to and higher than a supply voltage $V_{DD}$. The ratio between the array shape factor $(W/L)_F$ and the reference shape factor $(W/L)_R$ is a non-integer.

21 Claims, 3 Drawing Sheets

READING CIRCUIT FOR NONVOLATILE MEMORY CELLS WITHOUT LIMITATION OF THE SUPPLY VOLTAGE

TECHNICAL FIELD

The present invention refers to a reading circuit for nonvolatile memory cells without limitation of the supply voltage.

BACKGROUND OF THE INVENTION

As is known, the design of circuits for reading nonvolatile memory cells is currently affected by different factors, which are often in competition with one another. In particular, these circuits must be able to work effectively with supply voltages that vary within a wide range of values. In fact, reading circuits must be compatible with supply voltages that are very low (for example, 2.5 V), necessary for minimizing energy consumption, but, at the same time, they must be able to work with high supply voltages in order to guarantee fast access times (lower than 100 ns). In addition, they should have overall dimensions as reduced as possible in order to favor large scale integration.

A further constraint is represented by the fact that present fabrication technologies do not enable perfectly identical cell arrays to be made, but, in particular, there exists a dispersion of the values of the threshold voltages with respect to a nominal value. Consequently, in a memory array, the most erased cells will have a threshold voltage slightly higher than 0.5 V, whilst the threshold voltage of the least erased cells will be approximately 2.5 V. Since generally the read voltage is equal to the supply voltage, the dispersion of the threshold voltages raises problems when the supply voltage is low (e.g., 2.5 V, as mentioned above). In this case, in fact, the least erased cells conduct a very low current and may be interpreted as written cells, thus causing reading errors. In addition, very low current levels require long reading times, which are unacceptable.

One solution for the described reading problems is given by European Patent Application EP-A-0 814 482 entitled "Method and Circuit for Generating a Reference Signal for Reading a Nonvolatile Memory", filed on Jun. 18, 1996 in the name of the present applicant.

The above known solution will be described hereinafter for a better understanding of the problems met by the present invention, with reference to FIGS. 1 and 2, showing a reading circuit for nonvolatile memory cells and, respectively, plots of currents generated by this circuit. In FIG. 1, a reading circuit 1 comprises an array branch 2, a reference branch 3, a current-to-voltage converter 4, and a biasing and decoding circuit 5.

The array branch 2 in turn comprises a memory cell 7, for example of the flash type, belonging to a memory array 6 and connected to an array bit line 9 and, with a gate terminal, to a charge pump 10.

The charge pump 10 supplies an output voltage $V_O$ linked to the supply voltage $V_{DD}$ by the following relation:

$$V_O = K_1 + V_{DD} \quad (1)$$

where $K_1$ is a constant.

The reference branch 3 comprises a first NMOS transistor 13, connected, with a drain terminal, via a reference line 14, to the decoding and biasing circuit 5 and, with a gate terminal, to a second NMOS transistor 18, diode connected, having its drain terminal connected to a reference generator 15, which supplies at the output a current $I_R$. The first NMOS transistor 13 and the second NMOS transistor 18 form a first current mirror circuit 11 and have equal shape factors $(W/L)_G$, wherein W is the channel width and L is the channel length.

An array load 16, including a PMOS transistor in diode configuration, and a reference load 17, which belong to the current-to-voltage converter 4, form a second current mirror circuit 19 and are connected, via the biasing and decoding circuit 5, to the array bit line 9 and, respectively, to the reference line 14.

In addition, the reference load 17 has a shape factor $(W/L)_R$ greater than the shape factor $(W/L)_F$ of the array load 16. In particular, these shape factors are linked by the following relation:

$$(W/L)_R = N(W/L)_F \quad (2)$$

where N is an integer, for example 8, representing the current amplification of the second current mirror circuit 19.

Finally, a comparator 20, having a first input and a second input connected, respectively, with the array load 16 and with the reference load 17, has an output 21, defining the output of the reading circuit 1.

Operation of the device is as follows.

During reading, the reference current $I_R$ flowing in the second NMOS transistor 18 is mirrored in the first NMOS transistor 13. As described in the European Patent Application referred to previously, the reference current $I_R$ is obtained as a linear combination of two currents $I_1$ and $I_2$, carried by two reference cells not shown and having threshold voltages $V_{T1}$ and, respectively, $V_{T2}$. In detail, the reference current $I_R$ is given by the following relation:

$$I_R = (I_1 - I_2) + NI_2 \quad (3)$$

where N is the same number as that appearing in Eq. (2).

Since the reference cells (not shown) in the reference generator 15 are biased so as to work in the linear region, approximate values of the currents $I_1$ and $I_2$ are given by the following expressions:

$$I_1 = G(V_{GS1} - V_{T1}) \quad (4)$$

$$I_2 = G(V_{GS2} - V_{T2}) \quad (5)$$

where $V_{GS1}$ and $V_{GS2}$ are the respective gate-to-source voltages of the reference cells, and G is their transconductance, which is constant. In addition, the gate-to-source voltages $V_{GS1}$ and $V_{GS2}$, during reading, are equal to the supply voltage $V_{DD}$ of the reading circuit 1.

Substituting Eq. (4) and Eq. (5) into Eq. (3) and setting $V_{GS1} = V_{GS2} = V_{DD}$, the following relations are obtained:

$$I_R = G(V_{DD} - V_{T1}) \quad (6a)$$

$$I_R = G(V_{DD} - V_{T1}) - G(V_{DD} - V_{T2}) + NG(V_{DD} - V_{T2}) \quad (6b)$$

In particular, Eq. (6a) is valid for $V_{T1} < V_{DD} < V_{T2}$, whilst Eq. (6b) is valid for $V_{DD} > V_{T2}$. As illustrated in FIG. 2, the plot of the reference current $I_R$, expressed by relations (6a) and (6b) has a first rectilinear portion when the supply voltage $V_{DD}$ is between the threshold voltages $V_{T1}$ and $V_{T2}$, and a second rectilinear portion, with a slope equal to NG, for values of $V_{DD}$ greater than $V_{T2}$.

The reference current $I_R$ is compared with a current flowing in the reference load 17, the value of which is determined by the current flowing in the memory cell 7. In fact, the current $I_F$ flowing in the memory cell 7 and in the array load 16 is mirrored, amplified by a factor N, at the reference load 17. In addition, the charge pump 10 supplies to the gate terminal of the memory cell 7 a voltage equal to the supply voltage $V_{DD}$ increased by a constant boosting voltage $V_B$. As a result, if the memory cell 7 is written, the written cell current $I_W$ flowing in the reference load 17 is given by the following expression:

$$I_W = NG(V_{DD} + V_B - V_{TW}) \tag{7}$$

where $V_{TW}$ is the threshold voltage of a written cell. If, instead, the cell is erased, the erased cell current $I_E$ flowing in the reference load 17 is given by the following expression:

$$I_E = NG(V_{DD} + V_B - V_{TE}) \tag{8}$$

where $V_{TE}$ is the threshold voltage of an erased cell.

Expressions (7) and (8) may be rewritten as follows:

$$I_W = NG[V_{DD} - (V_{TW} - V_B)] \tag{9}$$

$$I_E = NG[V_{DD} - (V_{TE} - V_B)] \tag{10}$$

Consequently, the transcharacteristics $I_W - V_{DD}$ and $I_E - V_{DD}$, given in FIG. 2, are similar to those of cells identical to the memory cell 7, but having threshold voltages $V_{TW} - V_B$ and $V_{TE} - V_B$, respectively. In particular, the written cell current $I_W$ and the reference current $I_R$ (for $V_{DD} > V_{T2}$) have parallel plots, with a slope equal to NG. This proves advantageous in so far as no top limit is set to the value of the supply voltage $V_{DD}$, which can consequently be chosen so as to optimize the reading times.

Furthermore, when the reading circuit 1 is supplied with a low supply voltage $V_{DD}$, the value of the reference current $I_R$ is given by expression (6a). The minimum value theoretically acceptable for the supply voltage $V_{DD}$, given by the intersection between the transcharacteristics $I_R - V_{DD}$ and $I_E - V_{DD}$, is thus represented by the threshold voltage $V_{TE}$, decreased by the value of the boosting voltage $V_B$.

The solution described above operates properly for charge pumps of the type referred to above, which generate an output voltage according to relation (1), but presents a number of drawbacks when different types of pumps are used, for example, those of the single shot type, which are preferred in a number of applications on account of the zero consumption in stand-by and of the contained setting times. In fact, as is known, the output voltage $V_O$ of a single shot charge pump is given by the relation $$V_O = K_B V_{DD} \tag{11}$$

where $K_B$ represents the boosting efficiency. In the reading circuit 1, the output voltage $V_O$ of the charge pump 10 is equal to the gate-to-source voltage of the memory cell 7. In this case, then, the written cell current $I_W$ and the erased cell current $I_E$ are expressed, respectively, by the following relations:

$$I_W = NG(K_B V_{DD} - V_{TW}) \tag{12}$$

$$I_E = NG(K_B V_{DD} - V_{TE}) \tag{13}$$

thus, $$I_W = NK_B G(V_{DD} - V_{TW}/K_B) \tag{14}$$

$$I_E = NK_B G(V_{DD} - V_{TE}/K_B) \tag{15}$$

The transcharacteristics $I_W - V_{DD}$ and $I_E - V_{DD}$ are therefore equivalent to those of reference cells having threshold voltages equal to $V_{TW}/K_B$ and, respectively, $V_{TE}/K_B$, and a slope equal to $NK_B G$, as shown in FIG. 3. Consequently, the transcharacteristics $I_W - V_{DD}$ and $I_R - V_{DD}$ are no longer parallel and present a point of intersection A which represents a maximum value $V_{DDMAX}$ of the supply voltage $V_{DD}$. The expression of the maximum value $V_{DDMAX}$ may be obtained by equating relations (6b) and (14):

$$V_{DDMAX} = [N(V_{TW} - V_{T2}) + V_{T2} - V_{T1}]/[N(K_B - 1)] \tag{16}$$

Assuming typical values, such as $V_{TW} = 4.5$ V, $V_{T1} = 1.25$ V, $V_{T2} = 2.5$ V, $K_B = 1.6$ and $N = 8$, a maximum value $V_{DDMAX}$ of 3.6 V is obtained, which is too low and is not compatible with currently required standards.

SUMMARY OF THE INVENTION

The present invention provides a reading circuit that is free from the drawbacks described above.

According to the present invention a reading circuit for nonvolatile memory cells is provided, including a current-to-voltage converter having an array load connected to a memory cell and a reference load connected to a reference generator, the array load having an array shape factor $(W/L)_F$ and the reference load having a reference shape factor $(W/L)_R$, and the ratio between the array shape factor and the reference shape factor is a non-integer $(N/K_B)$ defined as an integer representing the current amplification of a current mirror circuit formed by the array load and the reference load and $K_B$ represents the boosting efficiency of a charge pump coupled to a control gate of the memory cell.

BRIEF DESCRIPTION OF THE DRAWINGS

For a better understanding of the present invention, an embodiment thereof is described hereinafter, purely as a non-limiting example, with reference to the attached drawings, wherein.

DETAILED DESCRIPTION OF THE INVENTION

Figure 1:
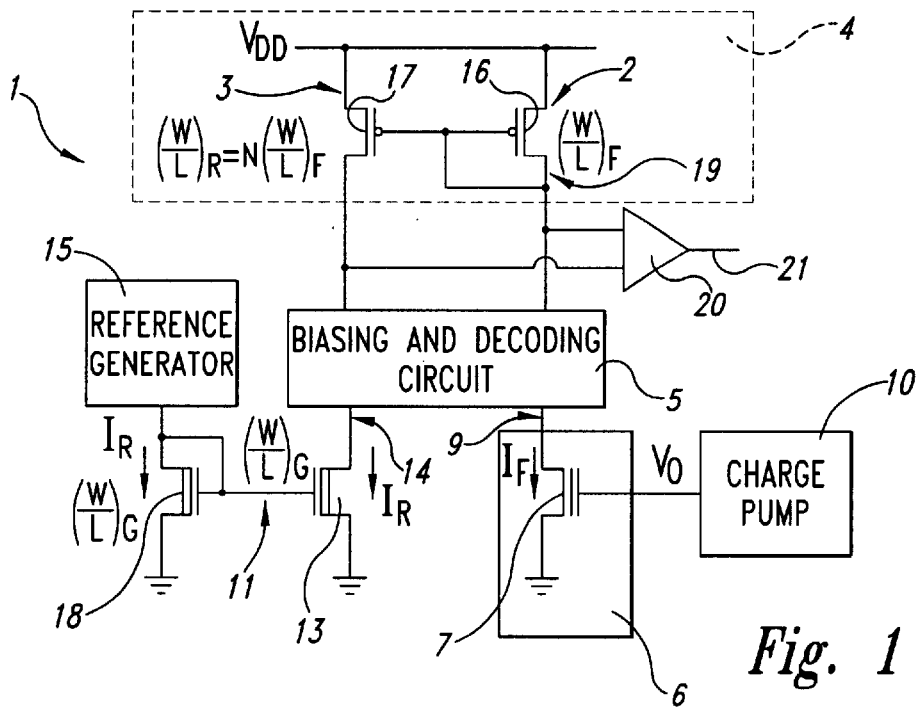
FIG. 1 is a simplified diagram of a reading circuit for nonvolatile memory cells.
Figure 4:
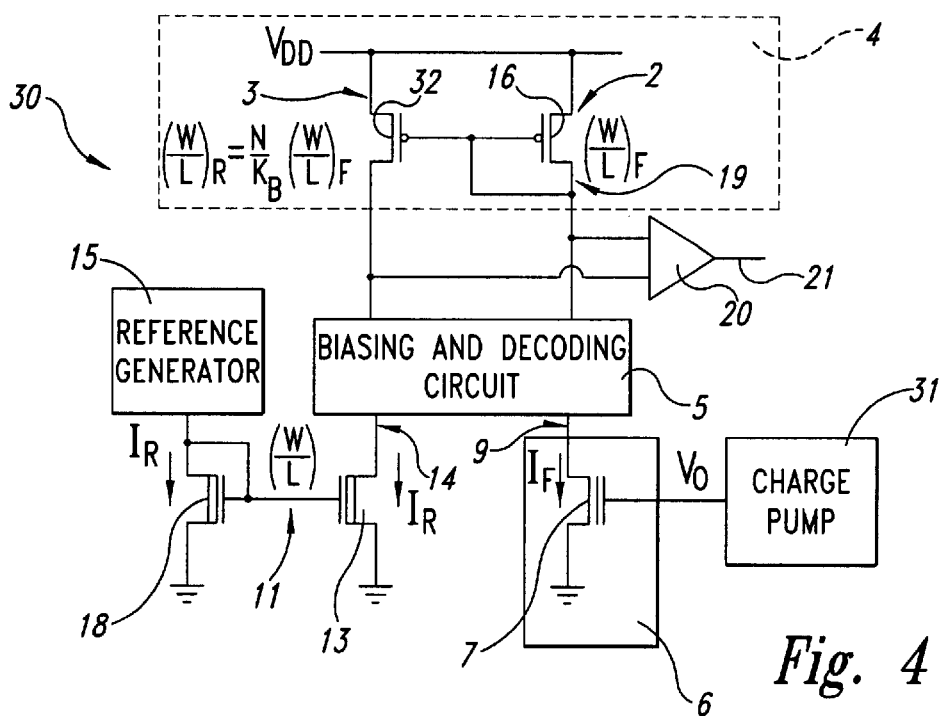
FIG. 4 is a simplified diagram of a reading circuit for nonvolatile memory cells according to the present invention.
Figure 2:
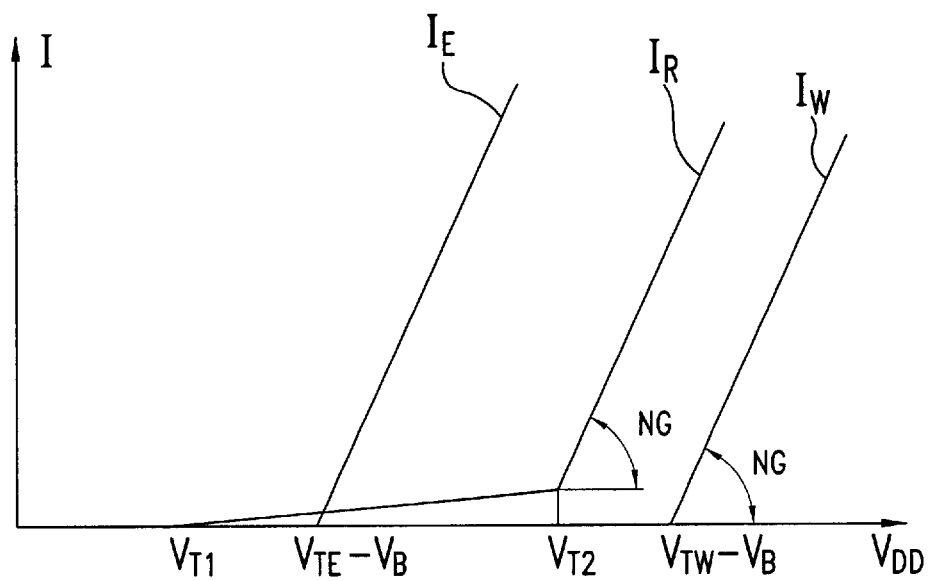
FIGS. 2 and 3 show characteristics for a first configuration and a second configuration of the circuit of FIG. 1.
Figure 3:
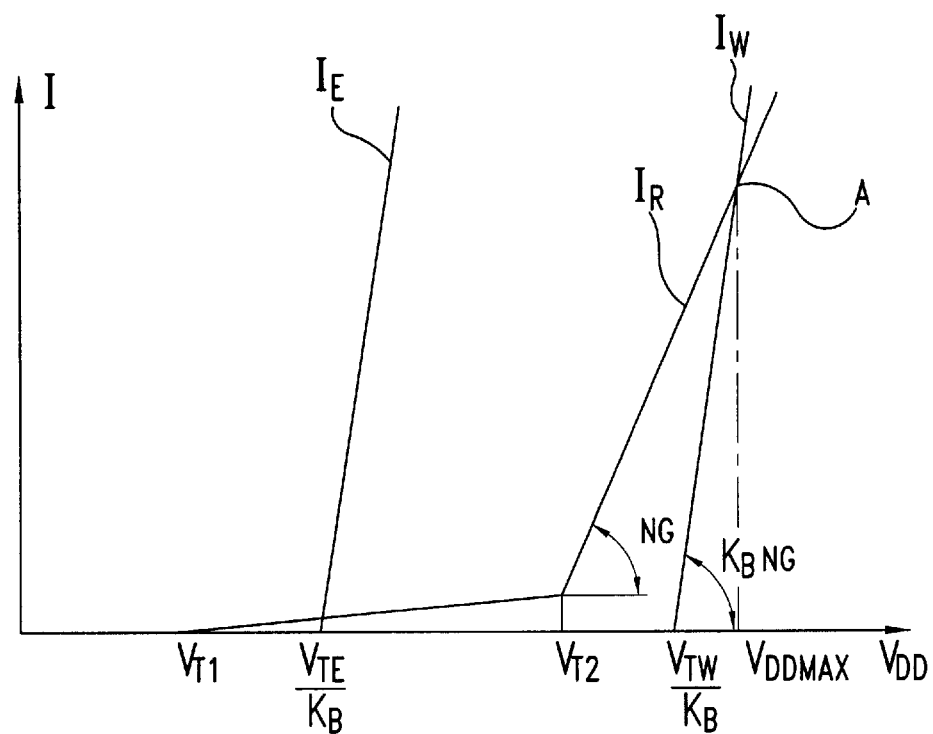

Referring first to FIG. 4, shown therein is a reading circuit 30 for nonvolatile memory cells, which is similar to the reading circuit 1 of FIG. 1. For this reason, the parts that are the same as those of FIG. 1 have the same reference numbers and are not described again.

The reading circuit 30 uses a single shot charge pump 31. In addition, the amplification value of the second current mirror circuit 19 is equal to a fractional value. In particular, in FIG. 4 the value of the shape factor $(W/L)_R$ of the reference load, here indicated by 32, is modified.

In detail, the single shot charge pump 31 supplies an output voltage $V_0$ equal to $K_B V_{DD}$, according to relation (11), supplied as gate-to-source voltage to the memory cell 7. The boosting efficiency value $K_B$ may be chosen in the design phase in a way that is known to the person skilled in the technology.

The shape factor $(W/L)_R$ of the reference load 32 is determined according to the following relation:

$$(W/L)_R = (N/K_B)(W/L)_F \tag{17}$$

where $(W/L)_F$ is the shape factor of the array load 16, and N is the amplification of the second current mirror 19 of the reading circuit 1 (FIG. 1), which also intervenes in defining the reference current $I_R$, according to relation (3).

Thereby, the written cell current $I_W$ and the erased cell current $I_E$ are given, respectively, by the following expressions:

$$I_W = (N/K_B) G(K_B V_{DD} - V_{TW}) \quad (18)$$

$$I_E = (N/K_B) G(K_B V_{DD} - V_{TE}) \quad (19)$$

whence $$I_W = NG(V_{DD} - V_{TW}/K_B) \quad (20)$$

$$I_E = NG(V_{DD} - V_{TE}/K_B) \quad (21)$$

Figure 5:
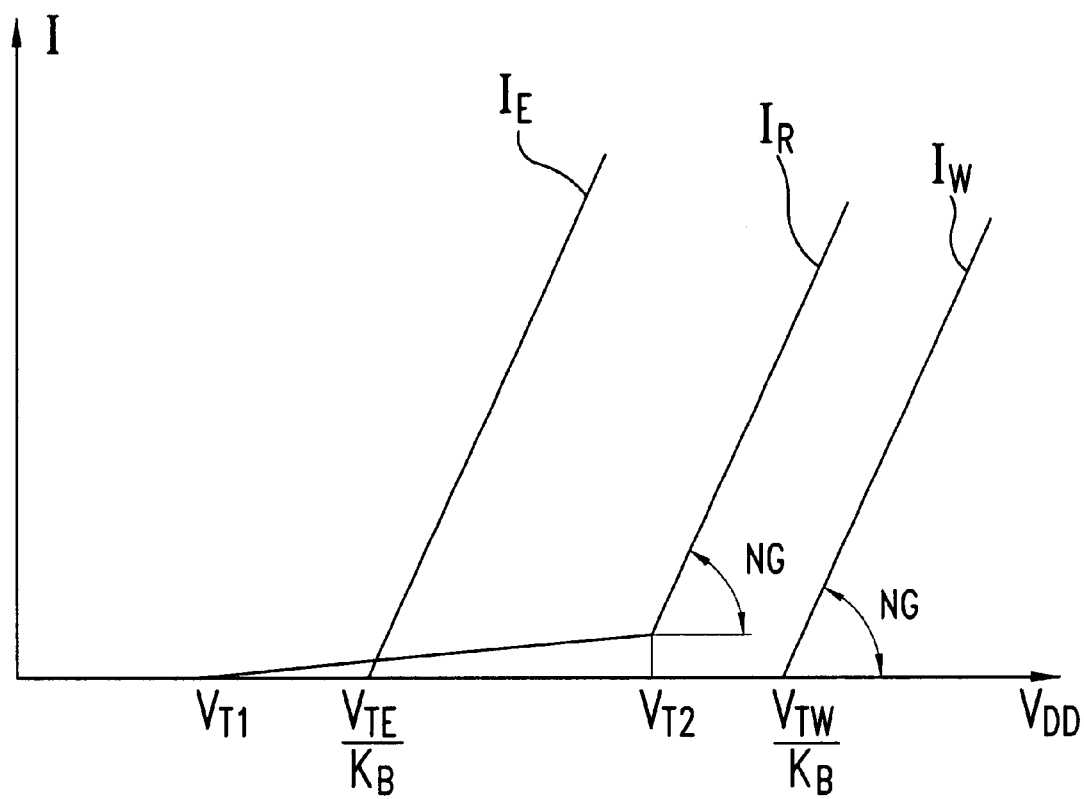
FIG. 5 shows characteristics for the circuit of FIG. 4.

As illustrated in FIG. 5, then, the transcharacteristics $I_W$–$V_{DD}$ and $I_E$–$V_{DD}$ are equivalent to the characteristics of cells having threshold voltages equal to $V_{TW}/K_B$ and, respectively, $V_{TE}/K_B$, and a slope equal to NG. Consequently, the transcharacteristics $I_W$–$V_{DD}$ and $I_R$–$V_{DD}$, which represent the plots of the written cell current $I_W$ and, respectively, of the reference current $I_R$, are parallel to one another for $V_{DD} > V_{T2}$.

The advantages of the described reading circuit are clear from the above. First, this circuit enables using charge pumps of the single shot type, which have low energy consumption, at the same time, this circuit is able to operate with a wide range of values of supply voltage $V_{DD}$. In fact, the transcharacteristics $I_W$–$V_{DD}$ and $I_R$–$V_{DD}$ do not present points of intersection, and hence, as previously discussed, no top limit is set to the value of the supply voltage $V_{DD}$. In particular, this value may be chosen so as to optimize the reading times of the memory cells.

In addition, the use of appropriately sized charge pumps of the single shot type is advantageous also from the point of view of circuit encumbrance.

Finally, it is clear that modifications and variations may be made to the reading circuit described and illustrated herein, without thereby departing from the scope of the invention as defined by the claims that follow and the equivalents thereof.

What is claimed is:

1. A reading circuit for nonvolatile memory cells, comprising: a current-to-voltage converter having an array load, connected to a memory cell, and a reference load connected to a reference generator; said array load having an array aspect ratio and said reference load having a reference aspect ratio; and the ratio between said array aspect ratio and said reference aspect ratio is a non-integer and the ratio between said reference aspect ratio and said array aspect ratio is also a non-integer.

2. The reading circuit of claim 1, further comprising boosting means supplying a biasing voltage to a gate terminal of said memory cell; said voltage being proportional to a supply voltage according to a multiplication factor that is greater than one, and wherein the ratio of the array aspect ratio and the reference aspect ratio is inversely proportional to said multiplication factor.

3. The reading circuit of claim 2, wherein said array load comprises a first transistor that is diode connected; said reference load comprises a second transistor and wherein the aspect ratio of said reference load is $N/K_B$ times greater than said aspect ratio of said array load, where N is an integer greater than unity and $K_B$ is said multiplication factor.

4. A reading circuit, comprising:
   an array load transistor coupled to a memory cell transistor;
   a reference load transistor coupled to a reference generator comprising a first current mirror; and
   the array load transistor having an aspect ratio defined by $(W/L)_F$ and the reference load transistor having an aspect ratio defined by $(W/L)_R$ where W is defined as the width of the respective channel and L is defined as the length of the respective channel of the transistors, and the array load transistor and the reference load transistor are configured such that the ratio of $(W/L)_F$ to $(W/L)_R$ is a non-integer and the ratio of $(W/L)_R$ to $(W/L)_F$ is a non-integer.

5. The circuit of claim 4, wherein the array load transistor and the reference oad transistor are coupled together to form a second current mirror.

6. The circuit of claim 4, further comprising a charge pump coupled to a control gate of the memory cell transistor.

7. The circuit of claim 6, wherein the array load transistor and the reference load transistor are coupled together to form a second current mirror.

8. The circuit of claim 7, wherein the array load transistor and the reference load transistor are configured such that the ratio of the array load transistor aspect ratio to the reference load transistor aspect ratio is defined as $(N/K_B)$, where N is an integer representing the second current mirror amplification and $K_B$ represents a boosting efficiency of the charge pump.

9. The circuit of claim 8, wherein the charge pump provides a biasing voltage that is proportional to a supply voltage in accordance with a multiplication factor that is represented by the boosting efficiency of the charge pump $K_B$ that is greater than 1, and wherein the ratio $(N/K_B)$ is inversely proportional to the multiplication factor.

10. The circuit of claim 4, wherein the array load transistor is diode connected, and further wherein the aspect ratio of the reference load transistor is $N/K_B$ times greater than the aspect ratio of the array load transistor where N is an integer representing the second current mirror amplification and $K_B$ represents a boosting efficiency of the charge pump.

11. A reading circuit for nonvolatile memory cells, comprising:
   a first current mirror having an array branch connected to the memory cell and a reference branch connected to a reference circuit, the array branch having an array aspect ratio and the reference branch having a reference aspect ratio, and wherein the reference aspect ratio is greater than the array aspect ratio; and a charge pump coupled to a control gate of the memory cell, wherein the ratio between the array aspect ratio and the reference aspect ratio is a non-integer $N/K_B$, wherein N represents the current amplification of the first current mirror, and $K_B$ represents the boosting efficiency of the charge pump.

12. The circuit of claim 11, wherein the first current mirror comprises an array load transistor coupled to a reference load transistor with the array load transistor diode connected.

13. The circuit of claim 12, wherein the array load transistor has an aspect ratio defined by $(W/L)_F$ and the array load transistor has an aspect ratio defined by $(W/L)_R$, where W is defined as the width of the channel and L is defined as the length of the channel of the respective transistors, and the ratio between the aspect ratios of the array load transistor and the resistor load transistor is defined by $N/K_B$, where N is an integer representing the current amplification of the first current mirror and $K_B$ represents the boosting efficiency of the charge pump, and $N/K_B$ is a non-integer.

14. The circuit of claim 13, wherein the reference circuit comprises a current mirror having a first diode connected transistor coupled to a reference generator and a second transistor having a gate coupled to a gate of the first transistor and a first terminal coupled to the reference load transistor.

15. The circuit of claim 14, further comprising a biasing and decoding circuit coupled between the reference circuit current mirror and the first current mirror and between the memory cell and the first current mirror.

16. A reading circuit for nonvolatile memory cells, comprising:
   a current-to-voltage converter having an array load connected to a memory cell and a reference load connected to a reference generator, the array loading having an array aspect ratio and the reference load having a reference aspect ratio, the ratio between the array aspect ratio and the reference aspect ratio is a non-integer; and
   boosting means supplying a biasing voltage to a gate terminal of the memory cell, the voltage being proportional to a supply voltage according to a multiplication factor greater than 1 and wherein the ratio is inversely proportional to the multiplication factor.

17. The reading circuit of claim 16 wherein the array load comprises a first transistor that is diode connected, said reference load comprises a second transistor, and the aspect ratio of the reference load is $N/K_B$ times greater than the aspect ratio of the array load, where N is an integer greater than unity and $K_B$ is the multiplication factor.

18. A reading circuit, comprising:
   an array load transistor coupled to a memory cell transistor;
   a reference load transistor coupled to a reference generator comprising a first current mirror, and coupled to the array load transistor to form a second current mirror;
   the array load transistor having an aspect ratio defined by $(W/L)_F$ and the reference load transistor having an aspect ratio defined by $(W/L)_R$ where W is defined as the width of the respective channel and L is defined as the length of the respective channel of the transistors, and the load transistor and the reference load transistor are configured such that the ratio of $(W/L)_F$ to $(W/L)_R$ is a non-integer; and
   a charge pump coupled to a control gate of the memory cell transistor, the array load transistor and the reference load transistor configured such that the ratio of the array load transistor aspect ratio to the reference load transistor aspect ratio is defined as $(N/K_B)$, where N is an integer representing the second current mirror amplification and $K_B$ represents a boosting efficiency of the charge pump.

19. A reading circuit, comprising:
   an array load transistor coupled to a memory cell transistor;
   a reference load transistor coupled to a reference generator comprising a first current mirror, and coupled to the array load transistor to form a second current mirror;
   the array load transistor having an aspect ratio defined by $(W/L)_F$ and the reference load transistor having an aspect ratio defined by $(W/L)_R$ where W is defined as the width of the respective channel and L is defined as the length of the respective channel of the transistors, and the load transistor and the reference load transistor are configured such that the ratio of $(W/L)_F$ to $(W/L)_R$ is a non-integer; and
   a charge pump coupled to a control gate of the memory cell transistor, the array load transistor and the reference load transistor configured such that the ratio of the array load transistor aspect ratio to the reference load transistor aspect ratio is defined as $(N/K_B)$, where N is an integer representing the second current mirror amplification and $K_B$ represents a boosting efficiency of the charge pump, wherein the charge pump provides a biasing voltage that is proportional to a supply voltage in accordance with a multiplication factor that is represented by the boosting efficiency of the charge pump $K_B$ that is greater than 1, and wherein the ratio $(N/K_B)$ is inversely proportional to the multiplication factor.

20. A reading circuit, comprising:
   an array load transistor coupled to a memory cell transistor;
   a reference load transistor coupled to a reference generator that comprises a current mirror; and
   the array load transistor having an aspect ratio defined by $(W/L)_F$ and the reference load transistor having an aspect ratio defined by $(W/L)_R$ where W is defined as the width of the respective channel and L is defined as the length of the respective channel of the transistors, and the array load transistor and the reference load transistor are configured such that the ratio of $(W/L)_F$ to $(W/L)_R$ is a non-integer, and the array load transistor is diode connected, and wherein the aspect ratio of the reference load transistor is $N/K_B$ times greater than the aspect ratio of the array load transistor, where N is an integer greater than unity and $K_B$ represents a multiplication factor greater than 1.

21. A reading circuit for nonvolatile memory cells, comprising:
   a current-to-voltage converter having an array load connected to a memory cell and a reference load connected to a reference generator, the array load having an array aspect ratio and the reference load having a reference aspect ratio, and the ratio between the array aspect ratio and the reference aspect ratio is a non-integer, and the aspect ratio of the reference load is inversely proportionate to $K_B$, where $K_B$ is a multiplication factor representing the ratio of a biasing voltage supplied to a gate terminal of the memory cell and a supply voltage.

* * * * *